US006781226B2

(12) United States Patent
Huppenthal et al.

(10) Patent No.: US 6,781,226 B2
(45) Date of Patent: Aug. 24, 2004

(54) RECONFIGURABLE PROCESSOR MODULE COMPRISING HYBRID STACKED INTEGRATED CIRCUIT DIE ELEMENTS

(75) Inventors: Jon M. Huppenthal, Colorado Springs, CO (US); D. James Guzy, Glenbrook, NV (US)

(73) Assignee: Arbor Company LLP, Glenbrook, NV (US)

( * ) Notice: Subject to any disclaimer, the term of this patent is extended or adjusted under 35 U.S.C. 154(b) by 0 days.

(21) Appl. No.: 10/452,113

(22) Filed: Jun. 2, 2003

(65) Prior Publication Data

US 2004/0000705 A1 Jan. 1, 2004

Related U.S. Application Data

(63) Continuation of application No. 10/012,057, filed on Dec. 5, 2001, now Pat. No. 6,627,985.

(51) Int. Cl.$^7$ .............................................. H01L 23/02
(52) U.S. Cl. .......................... 257/686; 326/41; 712/15; 257/723; 257/777
(58) Field of Search ............................. 326/41; 712/15; 257/686, 723, 777

(56) References Cited

U.S. PATENT DOCUMENTS

| | | | |
|---|---|---|---|
| 5,585,675 A | 12/1996 | Knopf | |
| 5,652,904 A | 6/1997 | Trimberger | |
| 5,838,060 A | 11/1998 | Comer | |
| 6,051,887 A | * 4/2000 | Hubbard | 257/777 |
| 6,072,233 A | 6/2000 | Corisis et al. | |
| 6,092,174 A | 7/2000 | Roussakov | |
| 6,313,522 B1 | * 11/2001 | Akram et al. | 257/686 |
| 6,449,170 B1 | 9/2002 | Nguyen et al. | |
| 6,451,626 B1 | 9/2002 | Lin | |

OTHER PUBLICATIONS

Hintzke, Jeff, Probing Thin Wafers: Requires Dedicated Measures, http://www.electroglas.com/products/White%20 Paper/Hintzke. Thin Paper.html. Electroglas, Inc. Aug. 21, 2001, pp. 1–6.
Lammers, David, AMD, LSI Logic will put processor, flash In single package,http://www.csdmaq.com/story/DEG2001023S0039. EE Times, Aug. 21, 2001, pp. 1–2.
Multi–Adaptive Processing (MAP™), http://www.srccomp.com/products map.htm. SRC Computers, Inc. Aug. 22, 2001, pp. 1–2.
System Architecture, http://www.srccomp.com/products.htm. SRC Computers, Inc, Aug. 22, 2001, pp.1–2.
Configurations, SRC Expandable Node, http://www.srccomp.com/products configs.htm, SRC Computers.Inc. Aug. 22, 2001, p.1.
Young, Jedediah J., Malshe, Ajay P., Brown, W.D., Lenihan, Timothy, Albert, Douglas, Ozguz, Volkan, Thermal Modeling and Mechanical Analysis of Very Thin Silicon Chips for Conformal Electronic Systems, University of Arkansas, Fayetteville, AR, pp.1–8, 2001.
Now Process Forms Die Interconnects by Vertical Wafer Stacking, http://www.chipscalereview.com/0001/technaws8.html. ChipScale Review, Jan.–Feb. 2000, Oct. 18, 2001, pp. 1–3.

(List continued on next page.)

*Primary Examiner*—Daniel D. Chang
(74) *Attorney, Agent, or Firm*—William J. Kubida; Peter J. Meza; Hogan & Hartson LLP

(57) ABSTRACT

A reconfigurable processor module comprising hybrid stacked integrated circuit ("IC") die elements. In a particular embodiment disclosed herein, a processor module with reconfigurable capability may be constructed by stacking one or more thinned microprocessor, memory and/or field programmable gate array ("FPGA") die elements and interconnecting the same utilizing contacts that traverse the thickness of the die. The processor module disclosed allows for a significant acceleration in the sharing of data between the microprocessor and the FPGA element while advantageously increasing final assembly yield and concomitantly reducing final assembly cost.

30 Claims, 4 Drawing Sheets

OTHER PUBLICATIONS

Savastiouk, Sergey, Siniaguine, Oleg, Francis, David, Thinning Wafers for Flip Chip Applications, http://www.iii1.com/hdlarticle.html. International Interconnection Intelligence, Oct. 18, 2001, pp. 1–13.

Savastiouk, Sergey, Siniaguine, Oleg, Korczynski, ED, Ultra–thin Bumped and Stacked WLP Using Thru–Silicon Vias, http://www.ectc.net/advance program/abstracts2000/s15p1.html. Tru–Si Technologies, Inc., Oct. 18, 2001, p. 1.

Savastiouk, Sergey, New Process Forms Die Interconnects by Vertical Wafer Stacking, http://www.trusi.com/article9.htm. ChipScale Review, Oct. 18, 2001, pp. 1–2.

Savastiouk, Sergey, Moore's Law–the z dimension, http://www.trusi.com/article7.htm. SolidState Technology, Oct. 18, 2001, pp. 1–2.

Through–Silicon Vias, http://www.trusi.com/throughsiliconvias.html. Tru–Si Technologies, Oct. 18, 2001, p. 1.

* cited by examiner

RECONFIGURABLE PROCESSOR MODULE COMPRISING HYBRID STACKED INTEGRATED CIRCUIT DIE ELEMENTS

RELATED APPLICATION

The present application is a continuation of U.S. patent application Ser. No. 10/012,057 filed Dec. 5, 2001, now U.S. Pat. No. 6,627,985 incorporated herein by reference in its entirety.

BACKGROUND OF THE INVENTION

The present invention relates, in general, to the field of systems and methods for reconfigurable, or adaptive, data processing. More particularly, the present invention relates to an extremely compact reconfigurable processor module comprising hybrid stacked integrated circuit ("IC") die elements.

In addition to current commodity IC microprocessors, another type of processing element is commonly referred to as a reconfigurable, or adaptive, processor. These reconfigurable processors exhibit a number of advantages over commodity microprocessors in many applications. Rather than using the conventional "load/store" paradigm to execute an application using a set of limited functional resources as a microprocessor does, the reconfigurable processor actually creates the number of functional units it needs for each application in hardware. This results in greater parallelism and, thus, higher throughput for many applications. Conventionally, the ability for a reconfigurable processor to alter its hardware compliment is typically accomplished through the use of some form of field programmable gate array ("FPGA") such as those produced by Altera Corporation, Xilinx, Inc., Lucent Technologies, Inc. and others.

In practice however, the application space over which such reconfigurable processors, (as well as hybrids combining both microprocessors and FPGAs) can be practically employed is limited by several factors.

Firstly, since FPGAs are less dense than microprocessors in terms of gate count, those packaged FPGAs having sufficient gates and pins to be employed as a general purpose reconfigurable processor ("GPRP"), are of necessity very large devices. This size factor alone may essentially prohibit their use in many portable applications.

Secondly, the time required to actually reconfigure the chips is on the order of many hundreds of milliseconds, and when used in conjunction with current microprocessor technologies, this amounts to a requirement of millions of processor clock cycles in order to complete the reconfiguration. As such, a high percentage of the GPRP's time is spent loading its configuration, which means the task it is performing must be relatively long-lived to maximize the time that it spends computing. This again limits its usefulness to applications that require the job not be context-switched. Context-switching is a process wherein the operating system will temporarily terminate a job that is currently running in order to process a job of higher priority. For the GPRP this would mean it would have to again reconfigure itself thereby wasting even more time.

Thirdly, since microprocessors derive much of their effective operational speed by operating on data in their cache, transferring a portion of a particular job to an attached GPRP would require moving data from the cache over the microprocessor's front side bus to the FPGA. Since this bus runs at about 25% of the cache bus speed, significant time is then consumed in moving data. This again effectively limits the reconfigurable processor to applications that have their data stored elsewhere in the system.

These three known limiting factors will only become increasingly significant as microprocessor speeds continue to increase. As a result, the throughput benefits that reconfigurable computing can offer to a hybrid system made up of existing, discrete microprocessors and FPGAs may be obviated or otherwise limited in its potential usefulness.

SUMMARY OF THE INVENTION

In accordance with the disclosure of a representative embodiment of the present invention, FPGAs, microprocessors and cache memory may be combined through the use of recently available wafer processing techniques to create a particularly advantageous form of hybrid, reconfigurable processor module that overcomes the limitations of present discrete, integrated circuit device implementations of GPRP systems. As disclosed herein, this new processor module may be conveniently denominated as a Stacked Die Hybrid ("SDH") Processor.

Tru-Si Technologies of Sunnyvale, Calif. (http://www.trusi.com) has developed a process wherein semiconductor wafers may be thinned to a point where metal contacts can traverse the thickness of the wafer creating small bumps on the back side much like those of a BGA package. By using a technique of this type in the manufacture of microprocessor, cache memory and FPGA wafers, all three die, or combinations of two or more of them, may be advantageously assembled into a single very compact structure thus eliminating or ameliorating each of the enumerated known difficulties encountered with existing reconfigurable technology discussed above.

Moreover, since these differing die do not require wire bonding to interconnect, it is now also possible to place interconnect pads throughout the total area of the various die rather than just around their periphery. This then allows for many more connections between the die than could be achieved with any other known technique.

Particularly disclosed herein is a processor module with reconfigurable capability constructed by stacking and interconnecting bare die elements. In a particular embodiment disclosed herein, a processor module with reconfigurable capability may be constructed by stacking thinned die elements and interconnecting the same utilizing contacts that traverse the thickness of the die. As disclosed, such a processor module may comprise a microprocessor, memory and FPGA die stacked into a single block.

Also disclosed herein is a processor module with reconfigurable capability that may include, for example, a microprocessor, memory and FPGA die stacked into a single block for the purpose of accelerating the sharing of data between the microprocessor and FPGA. Such a processor module block configuration advantageously increases final assembly yield while concomitantly reducing final assembly cost.

Further disclosed herein is an FPGA module that uses stacking techniques to combine it with a memory die for the purpose of accelerating FPGA reconfiguration. In a particular embodiment disclosed herein, the FPGA module may employ stacking techniques to combine it with a memory die for the purpose of accelerating external memory references as well as to expand its on chip block memory.

Also further disclosed is an FPGA module that uses stacking techniques to combine it with other die for the purpose of providing test stimulus during manufacturing as well as expanding the FPGA's capacity and performance. The technique of the present invention may also be used to advantageously provide a memory or input/output ("I/O") module with reconfigurable capability that includes a memory or I/O controller and FPGA die stacked into a single block.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
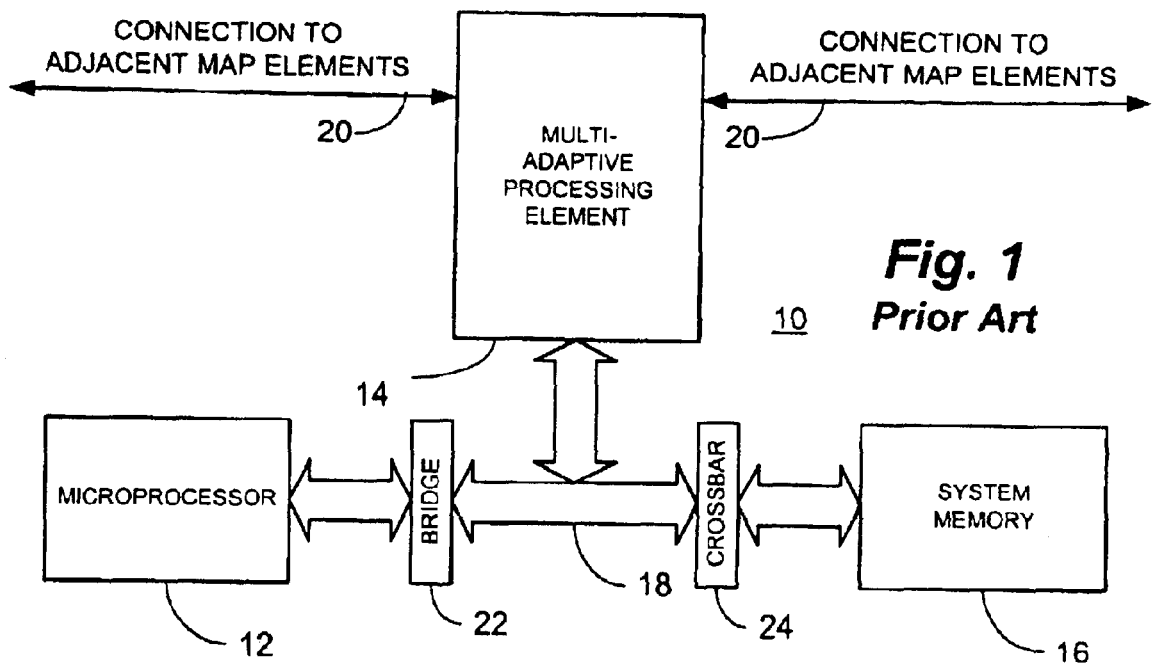
FIG. 1 is a simplified functional block diagram of a portion of a prior art computer system incorporating one or more multi-adaptive processing (MAP™ is a trademark of SRC Computers, Inc., Colorado Springs, Colo.) elements.
Figure 2:
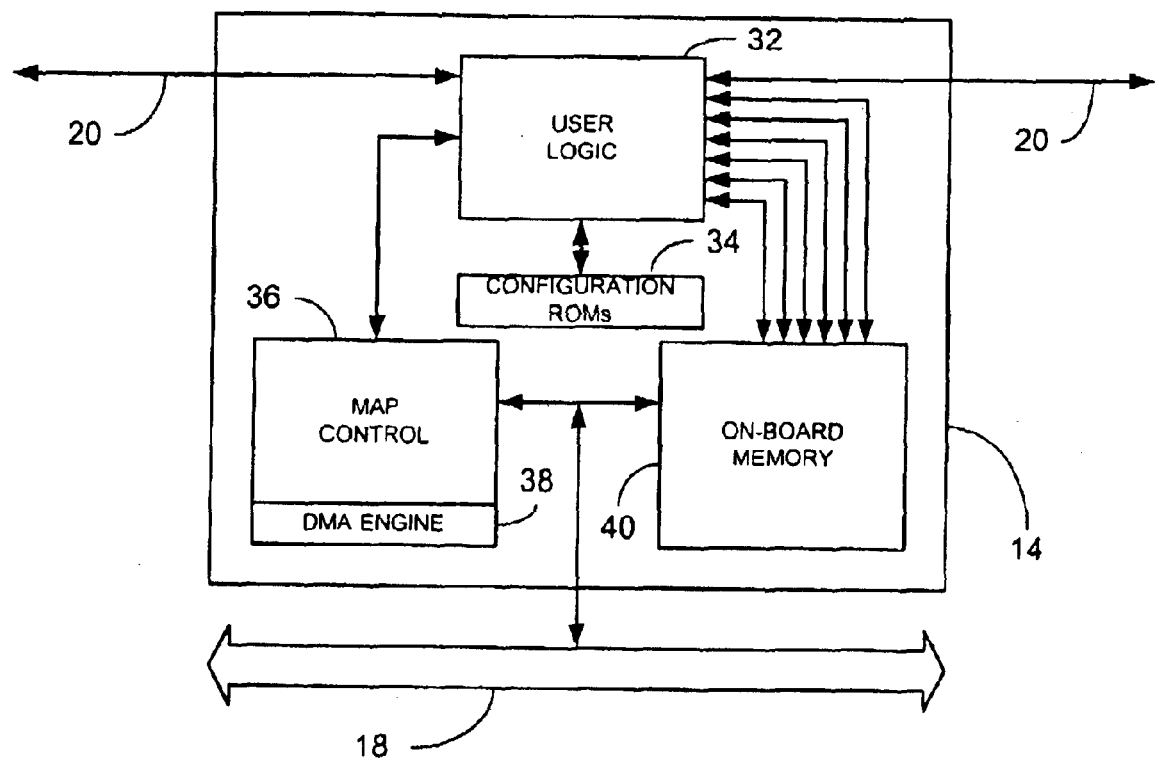
FIG. 2 is a more detailed, simplified functional block diagram of the multi-adaptive processing element illustrated in FIG. 1 illustrating the user logic block (which may comprise a field programmable gate array "FPGA") with its associated configuration read only memory ("ROM")

With reference now to FIG. 1, a simplified functional block diagram of a portion of a prior art reconfigurable computer system 10 is shown. The computer system 10 incorporates, in pertinent part, one or more microprocessors 12, one or more multi-adaptive processing (MAP™) elements 14 and an associated system memory 16. A system bus 18 bidirectionally couples a MAP element 14 to the microprocessor 12 by means of a bridge 22 as well as to the system memory 16 by means of a crossbar switch 24. Each MAP element 14 may also include one or more bidirectional connections 20 to other adjacent MAP elements 14 as shown With reference additionally now to FIG. 2, a more detailed, simplified functional block diagram of the multi-adaptive processing element 14 illustrated in the preceding figure is shown. The multi-adaptive processing element 14 comprises, in pertinent part, a user logic block 32, which may comprise an FPGA together with its associated configuration ROM 34. A MAP control block 36 and associated direct memory access ("DMA") engine 38 as well as an on-board memory array 40 is coupled to the user logic block 32 as well as the system bus 18.

Figure 3:
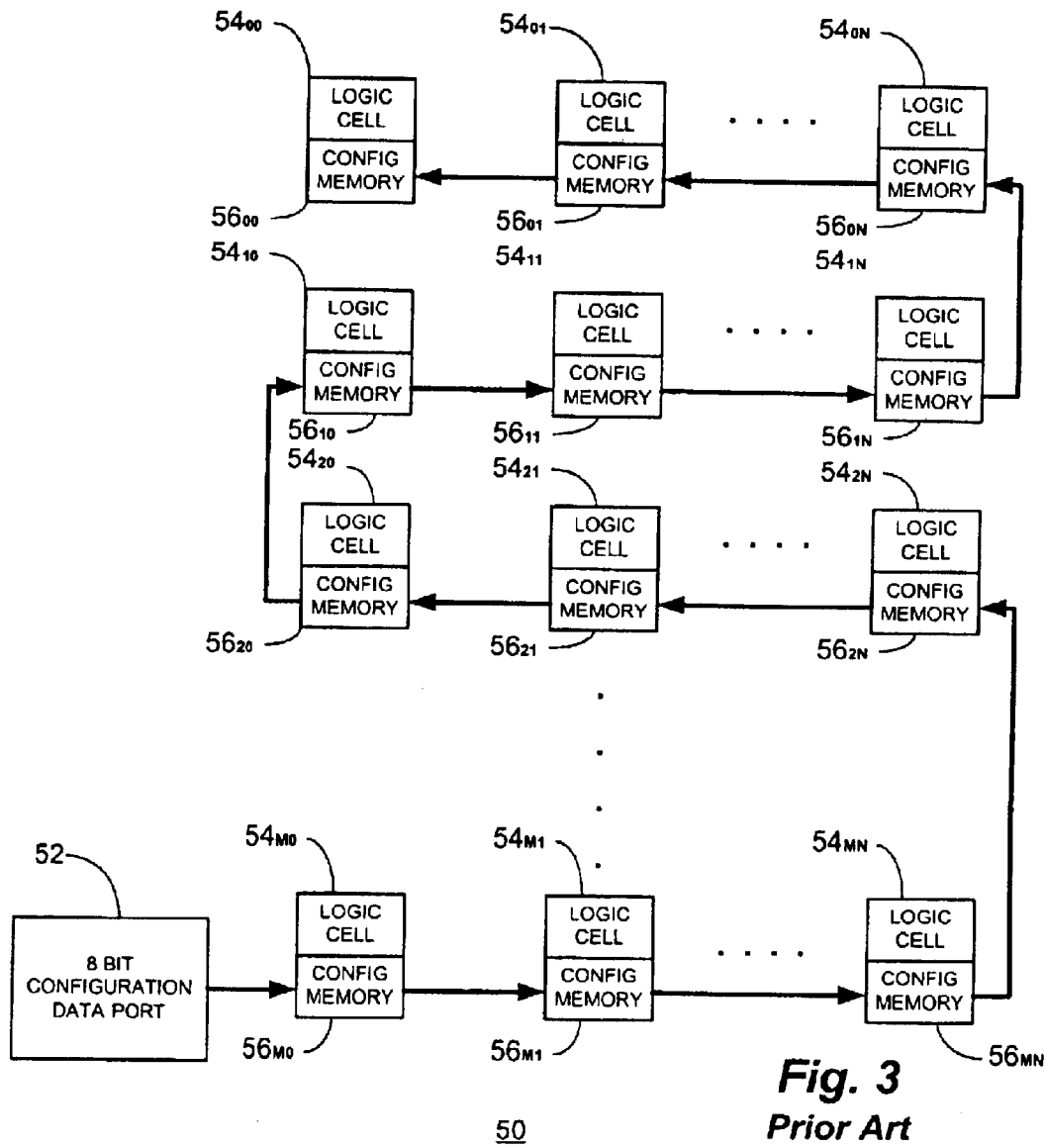
FIG. 3 is a functional block diagram of a representative configuration data bus comprising a number of static random access memory ("SRAM") cells distributed throughout the FPGA comprising the user logic lock of FIG. 2.

With reference additionally now to FIG. 3, a functional block diagram of a representative configuration data bus 50 is shown comprising a number of SRAM cells distributed throughout an FPGA comprising the user logic block 32 of the preceding figure. In a conventional implementation, the configuration information that programs the functionality of the chip is held in SRAM cells distributed throughout the FPGA as shown. Configuration data is loaded through a configuration data port 52 in a byte serial fashion and must configure the cells sequentially progressing through the entire array of logic cells 54 and associated configuration memory 56. It is the loading of this data through a relatively narrow, for example, 8 bit port that results in the long reconfiguration times.

Figure 4:
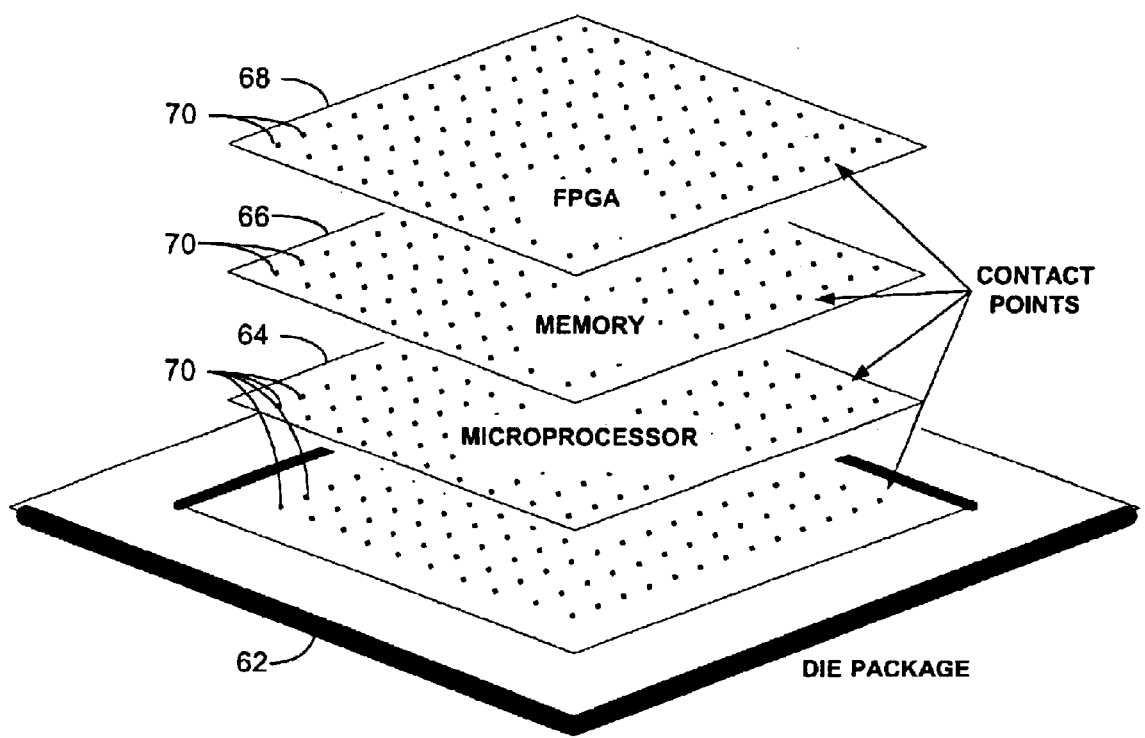
FIG. 4 is a simplified, exploded isometric view of a reconfigurable processor module in accordance with the present invention comprising a hybrid device incorporating a number of stacked integrated circuit die elements.

With reference additionally now to FIG. 4, a simplified, exploded isometric view of a reconfigurable processor module 60 in accordance with a representative embodiment of the present invention is shown comprising a hybrid device incorporating a number of stacked integrated circuit die elements. In this particular implementation, the module 60 comprises a die package 62 to which is coupled a microprocessor die 64, memory die 66 and FPGA die 68, all of which have a number of corresponding contact points, or holes, 70 formed throughout the area of the package 62 and various die 64, 66 and 68. It should be noted that a module 60 in accordance with the present invention may also comprise any combination of one or more of the microprocessor die 64, memory die 66 or FPGA 68 with any other of a microprocessor die 64, memory die 66 or FPGA die 68.

During manufacture, the contact holes 70 are formed in the front side of the wafer and an insulating layer of oxide is added to separate the silicon from the metal. Upon completion of all front side processing, the wafer is thinned to expose the through-silicon contacts. Using an atmospheric downstream plasma ("ADP") etching process developed by Tru-Si Technologies, the oxide is etched to expose the metal. Given that this etching process etches the silicon faster, the silicon remains insulated from the contacts.

By stacking die 64, 66 and 68 with through-silicon contacts as shown, the cache memory die 66 actually serves two purposes. The first of these is its traditional role of fast access memory. However in this new assembly it is accessible by both the microprocessor 64 and the FPGA 68 with equal speed. In those applications wherein the memory 66 is tri-ported, the bandwidth for the system can be further increased. This feature clearly solves a number of the problems inherent in existing reconfigurable computing systems and the capability of utilizing the memory die 66 for other functions is potentially very important.

Figure 5:
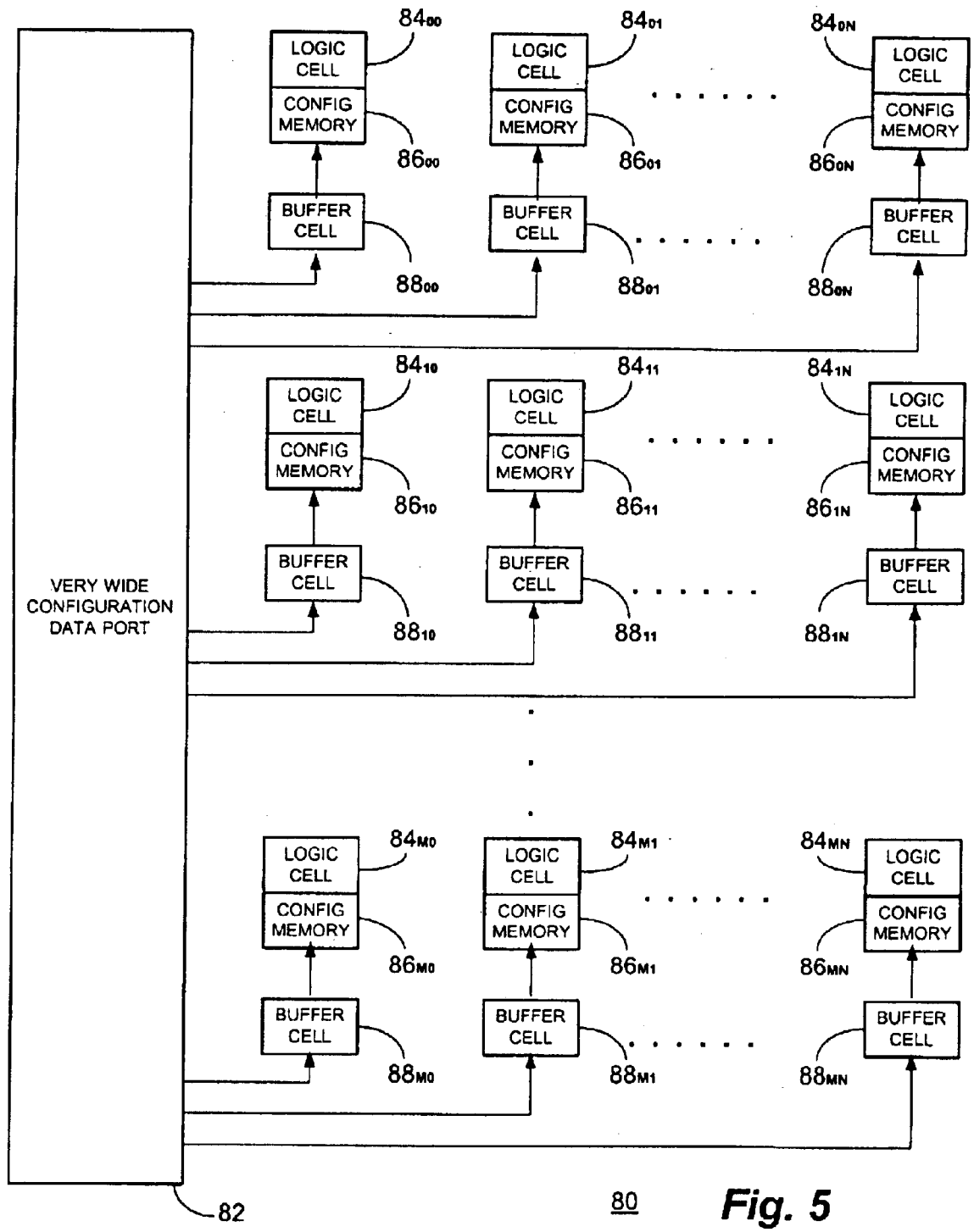
FIG. 5 is a corresponding functional block diagram of the configuration cells of the reconfigurable processor module of FIG. 4 wherein the FPGA may be totally reconfigured in one clock cycle by updating all of the configuration cells in parallel.

With reference additionally now to FIG. 5, a corresponding functional block diagram of the configuration cells 80 of the reconfigurable processor module 60 of the preceding figure is shown wherein the FPGA 70 may be totally reconfigured in one clock cycle by updating all of the configuration cells in parallel. As opposed to the conventional implementation of FIG. 3, a wide configuration data port 82 is included to update the various logic cells 84 through an associated configuration memory 86 and buffer cell 88. The buffer cells 88 are preferably a portion of the memory die 66 (FIG. 4). In this manner, they can be loaded while the FPGA 68 comprising the logic cells 84 are in operation. This then enables the FPGA 68 to be totally reconfigured in one clock cycle with all of it configuration logic cells 84 updated in parallel. Other methods for taking advantage of the significantly increased number of connections to the cache memory die 66 (FIG. 4) may include its use to totally replace the configuration bit storage on the FPGA die 68 as well as to provide larger block random access memory ("RAM") than can be offered within the FPGA die 68 itself.

In addition to these benefits, there is an added benefit of overall reduced power requirements and increased operational bandwidth. Because the various die 64, 66 and 68 (FIG. 4) have very short electrical paths between them, the signal levels can be reduced while at the same time the interconnect clock speeds can be increased.

Another feature of a system incorporating a reconfigurable processor module 60 is that the FPGA 68 can be configured in such a way as to provide test stimulus to the microprocessor 64, or other chips in the stack of the die package 62 during manufacture and prior to the completion of the module packaging. After test, the FPGA 68 can then be reconfigured for whatever function is desired. This then allows more thorough testing of the assembly earlier in the manufacturing process than could be otherwise achieved with traditional packaged part test systems thus reducing the costs of manufacturing.

It should be noted that although a single FPGA die 68 has been illustrated, two or more FPGA die 68 may be included in the reconfigurable module 60. Through the use of the through-die area array contacts 70, inter-cell connections currently limited to two dimensions of a single die, may be routed up and down the stack in three dimensions. This is not known to be possible with any other currently available stacking techniques since they all require the stacking contacts to be located on the periphery of the die. In this fashion, the number of FPGA die 68 cells that may be accessed within a specified time period is increased by up to 4VT/3, where "V" is the propagation velocity of the wafer and "T" is the specified time of propagation.

Obviously these techniques are similarly applicable if other die types are added or substituted into the stack. These may include input/output ("I/O") application specific integrated circuits ("ASICs") or memory controllers and the like.

The disclosed technique for die interconnection used in forming the module of the present invention is superior to other available alternatives for several reasons. First, while it would be possible to stack pre-packaged components instead, the I/O connectivity between such parts would be much lower and limited to the parts' periphery, thereby obviating several of the advantages of the stacked die system disclosed. Collocating multiple die on a planar substrate is another possible technique, but that too suffers from limited I/O connectivity and again does not allow for area connections between parts. Another option would be to fabricate a single die containing microprocessor, memory and FPGA. Such a die could use metalization layers to interconnect the three functions and achieve much of the benefits of die stacking. However such a die would be extremely large resulting in a much lower production yield than the three separate die used in a stacked configuration. In addition, stacking allows for a ready mix of technology families on different die as well as offering a mix of processor and FPGA numbers and types. Attempting to effectuate this with a single large die would require differing mask sets for each combination, which would be very costly to implement.

While there have been described above the principles of the present invention in conjunction with specific integrated circuit die elements and configurations for a specific application, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A processor module comprising:
   at least one field programmable gate array integrated circuit die element including a programmable array; and
   at least one microprocessor integrated circuit die element stacked with and electrically coupled to said programmable array of said at least one field programmable gate array integrated circuit die element,
   such that processing of data shared between the microprocessor and the field programmable gate array is accelerated.

2. The processor module of claim 1 further comprising:
   at least one memory integrated circuit die element stacked with and electrically coupled to either said at least one of field programmable gate array or said at least one microprocessor integrated circuit die elements.

3. The processor module of claim 1 wherein said programmable array is configurable as a processing element.

4. The processor module of claim 1 wherein said at least one field programmable gate array and said at least one microprocessor integrated circuit die elements are electrically coupled by a number of contact points distributed throughout the surfaces of said die elements.

5. The processor module of claim 4 wherein said contact points traverse said die elements through a thickness thereof.

6. The processor module of claim 5 wherein said die elements are thinned to a point at which said contact points traverse said thickness of said die elements.

7. A processor module comprising:
   at least one field programmable gate array integrated circuit die element including a programmable array; and,
   at least one microprocessor integrated circuit die element stacked with and electrically coupled to said programmable array of said at least one field programmable gate array integrated circuit die element,
   the at least one field programmable gate array integrated circuit die element being configured to provide test stimulus to the at least one microprocessor integrated circuit die element during manufacture and prior to completion of the module packaging.

8. The processor module of claim 7 further comprising:
   at least one memory integrated circuit die element stacked with and electrically coupled to either said at least one field programmable gate array or microprocessor integrated circuit die elements.

9. The processor module of claim 7 wherein said programmable array is configurable as a processing element.

10. The processor module of claim 7 wherein said at least one field programmable gate array and said at least one microprocessor integrated circuit die elements are electrically coupled by a number of contact points distributed throughout the surfaces of said die elements.

11. The processor module of claim 10 wherein said contact points traverse said die elements through a thickness thereof.

12. The processor module of claim 11 wherein said die elements are thinned to a point at which said contact points traverse said thickness of said die elements.

13. A processor module comprising:
- at least a first integrated circuit die element including a programmable array;
- at least a second integrated circuit die element including a processor stacked with and electrically coupled to said programmable array of said first integrated circuit die element;
- at least a third integrated circuit die element including a memory stacked with and electrically coupled to said programmable array and said processor of said first and second integrated circuit die elements respectively; and
- means for reconfiguring the programmable array within one clock cycle.

14. The processor module of claim 13 wherein the reconfiguring means comprises a wide configuration data port.

15. The processor module of claim 13 wherein said programmable array of said first integrated circuit die element comprises a field programmable gate array.

16. The processor module of claim 13 wherein said processor of said second integrated circuit die element comprises a microprocessor.

17. The processor module of claim 13 wherein said memory of said third integrated circuit die element comprises a memory array.

18. The processor module of claim 13 wherein said programmable array is configurable as a processing element.

19. The processor module of claim 13 wherein said first, second and third integrated circuit die elements are electrically coupled by a number of contact points distributed throughout the surfaces of said die elements.

20. The processor module of claim 19 wherein said contact points traverse said die elements through a thickness thereof.

21. The processor module of claim 20 wherein said die elements are thinned to a point at which said contact points traverse said thickness of said die elements.

22. A processor module comprising:
- at least a first integrated circuit die element including a programmable array and a plurality of configuration logic cells;
- at least a second integrated circuit die element including a processor stacked with and electrically coupled to said programmable array of said first integrated circuit die element;
- at least a third integrated circuit die element including a memory stacked with and electrically coupled to said programmable array and said processor of said first and second integrated circuit die elements respectively; and
- means for updating the plurality of configuration logic cells within one clock cycle.

23. The processor module of claim 22 wherein the updating means comprises a wide configuration data port.

24. The processor module of claim 22 wherein said programmable array of said first integrated circuit die element comprises a field programmable gate array.

25. The processor module of claim 22 wherein said processor of said second integrated circuit die element comprises a microprocessor.

26. The processor module of claim 22 wherein said memory of said third integrated circuit die element comprises a memory array.

27. The processor module of claim 22 wherein said programmable array is configurable as a processing element.

28. The processor module of claim 22 wherein said first, second and third integrated circuit die elements are electrically coupled by a number of contact points distributed throughout the surfaces of said die elements.

29. The processor module of claim 28 wherein said contact points traverse said die elements through a thickness thereof.

30. The processor module of claim 29 wherein said die elements are thinned to a point at which said contact points traverse said thickness of said die elements.

* * * * *

UNITED STATES PATENT AND TRADEMARK OFFICE
CERTIFICATE OF CORRECTION

PATENT NO. : 6,781,226 B2
DATED : August 24, 2004
INVENTOR(S) : Jon M. Huppenthal and D. James Guzy It is certified that error appears in the above-identified patent and that said Letters Patent is hereby corrected as shown below:

Column 6,
Line 47, delete ","

Signed and Sealed this

Thirtieth Day of November, 2004

JON W. DUDAS
*Director of the United States Patent and Trademark Office*